(12) United States Patent  
Nakatsuka

(10) Patent No.: US 6,208,521 B1
(45) Date of Patent: Mar. 27, 2001

(54) FILM CARRIER AND LAMINATE TYPE MOUNTING STRUCTURE USING SAME

(75) Inventor: Yasuo Nakatsuka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/080,454

(22) Filed: May 19, 1998

(30) Foreign Application Priority Data

| May 19, 1997 | (JP) | ................................................... 9-128406 |
| Oct. 29, 1997 | (JP) | ................................................... 9-297476 |
| Oct. 29, 1997 | (JP) | ................................................... 9-297581 |

(51) Int. Cl.[7] ............................. H05K 7/02; H05K 7/20; H01L 27/00
(52) U.S. Cl. ........................ 361/749; 361/720; 361/783; 174/254; 174/268; 257/706; 257/723; 257/777
(58) Field of Search .................................. 361/719–721, 361/749–751, 803, 783; 174/254, 268; 257/686, 706, 707, 723, 724, 777; 439/67, 77, 493; 29/830, 832, 840, 846, 850, 854

(56) References Cited

U.S. PATENT DOCUMENTS

| 3,242,384 | * | 3/1966 | Klehm, Jr. ............................ 361/749 |
| 3,873,889 | * | 3/1975 | Leyba ................................... 361/749 |
| 4,991,290 | * | 2/1991 | MacKay ................................ 29/854 |
| 5,008,496 | * | 4/1991 | Schmidt et al. ...................... 174/254 |
| 5,220,488 | * | 6/1993 | Denes ................................... 174/254 |
| 5,224,023 | * | 6/1993 | Smith et al. .......................... 174/254 |
| 5,252,857 | * | 10/1993 | Kane et al. ........................... 257/724 |
| 5,265,322 | * | 11/1993 | Fisher et al. ............................. 39/832 |
| 5,345,205 | * | 9/1994 | Kornrumpf ............................ 361/749 |
| 5,386,341 | * | 1/1995 | Olson et al. ........................... 361/749 |
| 5,448,511 | * | 9/1995 | Paurus et al. ......................... 361/749 |
| 5,519,578 | * | 5/1996 | Fujii ..................................... 361/749 |
| 5,565,705 | * | 10/1996 | Romero et al. ....................... 257/723 |
| 5,646,446 | * | 7/1997 | Nicewarner, Jr. et al. ........... 257/723 |
| 5,717,556 | * | 2/1998 | Yanagida .............................. 361/749 |
| 5,789,815 | * | 8/1998 | Tessier et al. ........................ 361/749 |
| 5,805,422 | * | 9/1998 | Otake et al. .......................... 361/749 |
| 5,926,369 | * | 7/1999 | Ingraham et al. .................... 361/749 |
| 5,956,234 | * | 9/1999 | Mueller ................................ 361/749 |
| 5,963,427 | * | 10/1999 | Bollesen .............................. 361/749 |

FOREIGN PATENT DOCUMENTS

| 521 735 A1 | * | 1/1993 | (EP) . |
| 6-13727 | * | 1/1994 | (JP) . |

* cited by examiner

Primary Examiner—Jeffrey Gaffin
Assistant Examiner—John B. Vigushin
(74) Attorney, Agent, or Firm—Wenderoth, Lind & Ponack, L.L.P.

(57) ABSTRACT

A film carrier to be used for fabricating a new laminate type mounting structure, a new laminate type mounting structure comprising semiconductor elements mounted on the film carrier of the present invention and the laminate type mounting structure comprising a heat-releasing structure are provided. Due to the invention of the film carrier, handling of the semiconductor elements as well as fabrication of a laminate type mounting structure are facilitated. When a heat-releasing structure is added, the laminate type mounting structure of the present invention can advantageously efficiently release the heat generated by the semiconductor element in each layer.

30 Claims, 13 Drawing Sheets

FILM CARRIER AND LAMINATE TYPE MOUNTING STRUCTURE USING SAME

FIELD OF THE INVENTION

The present invention relates to a film carrier on which to mount a semiconductor element and a laminate type semiconductor device fabricated by mounting semiconductor elements on the film carrier.

BACKGROUND OF THE INVENTION

So as to meet the demand in recent years for highly functional, small electronics, a laminate type mounting structure has been proposed. In this structure, semiconductor elements (particularly naked IC chips cut out from a wafer) are mounted on film carriers and the film carriers are laminated on a substrate and connected (Japanese Patent Unexamined Publication No. 290048/1990).

For example, conventional laminate type mounting structures have the following construction. That is, as shown in FIG. 13, one semiconductor element 61 is mounted on one TAB tape and plural TAB tapes are laminated on an external circuit board 63. Leads 62 formed on the TAB tapes on respective layers are connected to electrodes 64 of each external circuit board 63.

In manufacturing such laminate type mounting structures, nevertheless, chips on TAB tapes are separately handled until they are laminated, since one chip is mounted on one TAB tape, which is inconvenient in transport and storage.

In the above-mentioned structure, moreover, leads 62 require modification of their bent shape and size thereof in every layer of laminate to reach external circuit board 63, and such modification of the leads requires high technical skills.

When laminating, moreover, positioning of leads 62 of semiconductor element 61 and 64 of the electrodes external circuit board is difficult It is also problematic that the connections between leads 62 and electrodes 64 of the external circuit board can only be made using a special connection tool (jig).

The TAB tape necessary for the mounting is expensive and the production cost of the above-mentioned structure becomes high. In addition, the above laminate type mounting structure does not have a structure to externally and efficiently release the heat generated in the semiconductor element in each layer.

It is therefore an object of the present invention to solve the above-mentioned problems and to provide a film carrier to be used for fabricating a new laminate type mounting structure.

Another object of the present invention is to provide a new laminate type mounting structure by mounting semiconductor elements on the film carrier of the present invention.

A further object of the present invention is to impart a heat-releasing structure to the laminate type mounting structure of the present invention.

SUMMARY OF THE INVENTION

The film carrier of the present invention comprises a plurality of film carrier members of the following (A) that are connected, via folding parts, in the direction of the extension of each plane. One of the film carrier members becomes a base member and the film carrier members other than the base member constitute a single laminate structure as a whole, upon folding the film carrier at the folding parts, whereby respective layers are laminated on the base member. The conductive circuits in the film carrier members are connected to the conductive circuit in the base member through the inside of the folding part In addition, a connection part to connect an external substrate is formed on a connection plane on the rear surface of the mounting plane of the base member. This connection part is electrically continuous with the conductive circuit (A): a film carrier is to be the minimum unit constituting the inventive film carrier. It comprises a conductive circuit formed in an insulating substrate, and at least one surface of the insulating substrate is a mounting plane on which to mount a semiconductor element. The mounting plane having a mounting connection part is electrically continuous with to the conductive circuit.

The laminate type mounting structure of the present invention comprises the inventive film carrier. The film carrier comprises film carrier members respectively mounting semiconductor elements on the mounting planes thereof. The film carrier is folded at a folding part, whereby each film carrier member other than the base member is laminated on the base member. As a result, the connection plane of the base member becomes the lowermost plane of the laminate structure, thus forming a single laminate structure as a whole.

In the above-mentioned laminate type mounting structure of the present invention, a heat-absorbing plate (heat conduction type) is sandwiched at least between two layers from among the layers constituting the aforesaid laminate structure. A heat-releasing plate (heat conduction type) is set on the uppermost plane of the laminate structure. The heat-absorbing plate and heat-releasing plate are connected to each other in a heat conductive manner.

In the film carrier of the present invention, film carrier members in the number desired to be laminated are connected, via folding parts, in the extending direction of the plane in a developmental manner and connected to form a single film carrier. Thus, semiconductor elements can be easily mounted on a single film carrier. This means that there is no need to prepare a film carrier for each semiconductor element or to separately prepare for mounting of each semiconductor element, thereby eliminating dispersion of mounted semiconductor elements. In addition, a simple step of folding at the folding part enables integral lamination of plural semiconductor elements and easy positioning of the semiconductor elements.

In the inventive laminate type mounting structure, each of the mounted semiconductor elements is electrically continuous with a mounting connection part formed on the mounting plane of the base member, by a conductive circuit inside the insulating substrate, and the connection between layers has been completed. In the conventional laminate type mounting structure, individual film carriers are laminated on external circuit boards, and each layer and an external circuit board are connected by a lead to complete a laminate type mounting structure. In contrast, in accord with the inventive laminate type mounting structure, layers have been connected before establishing a connection with an external circuit board, and connection points with the external circuit board concentrate on one surface. By setting the laminate type mounting structure on an external circuit board, a laminate type mounting structure having an external terminal interchangeable with conventional products can be provided.

The connection between the inventive laminate type mounting structure and external circuit board is established utilizing the connection parts on the base members. The semiconductor element does not need to be connected to an external circuit board with a lead. Therefore, conventional problems of high technique and processing for lead bending, positioning of the lead and external circuit board, and the need to use a special tool can be entirely obliterated, and a connection to an external circuit board can be easily established.

In the present invention, moreover, the heat-releasing structure to be further set in the laminate type mounting structure has the following structure. That is, a heat-absorbing plate is sandwiched between desired layers from among the layers constituting the aforesaid laminate, preferably between all layers. In addition, a heat-releasing plate is set on the uppermost plane of the laminate. This heat-absorbing plate and the heat-releasing plate are connected in a heat conductive manner. This heat-releasing structure can be formed by merely folding a heat conductive plate, and thus, is a simple and effective one. Moreover, it can be easily incorporated into the laminate structure of the semiconductor elements on the film carrier of the present invention. This heat-releasing structure enables suitable conduction of the heat, generated by the action of the semiconductor element, to the heat-releasing plate from where the heat is released to the outside.

BRIEF DESCRIPTION OF THE DRAWINGS

FIG. 1(a) shows the side where a mounting plane of the base member exists (top view), and FIG. 1(b) is a cross sectional view of the film carrier of FIG. 1(a) along the longitudinal direction. In FIG. 1(a), only the folding part is hatched and in FIG. 1(b), only the conductive circuit is hatched.

DETAILED DESCRIPTION OF THE INVENTION

Figure 1:
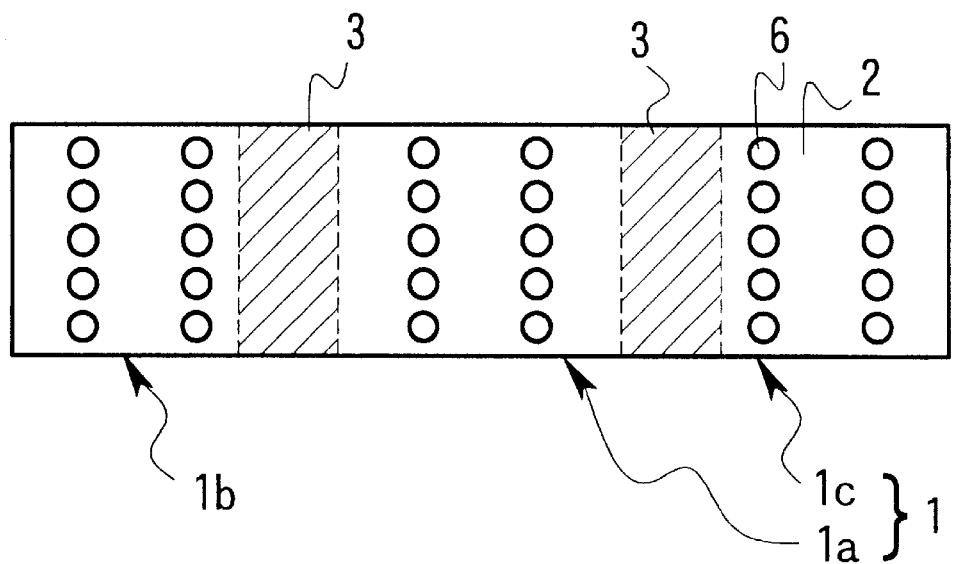
FIGS. 1(a) and 1(b) show one embodiment of the inventive film carrier.
Figure 1:
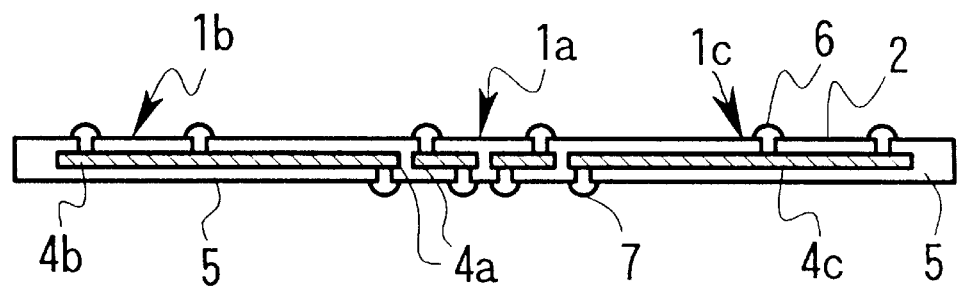

The film carrier of the present invention has a structure wherein, as shown in FIG. 1(a), film carrier members 1 (1a, 1b, 1c) are connected, via folding parts 3, in the direction of the extension of each plane. In the embodiment of FIG. 1, three film carrier members are connected linearly via folding parts.

The film carrier member is a minimum film carrier unit constituting the inventive film carrier, and is the same as the conventional film carrier in that a semiconductor element (bare chip) can be mounted thereon. However, it is different from a conventional film carrier in that it is connected to a different film carrier and the circuit is continued inside the film carrier. The film carrier member 1b in FIG. 1(b) has the following structure. That is, a conductive circuit 4b is formed inside an insulating substrate 5, and at least one surface (in the embodiment of FIG. 1, only one surface) of the insulating substrate 5 becomes a mounting plane 2 for mounting a semiconductor element The mounting plane 2 has a mounting connection part 6 for mounting a semiconductor element, and said mounting connection part 6 is electrically continuous with the conductive circuit 4b by the conductive path formed beneath the part 6.

Of the connected film carrier members 1a–1c, one film carrier member 1a is a base member 1a. The base member 1a is the same as other film carrier members in that one surface of the insulating substrate 5 is a mounting plane 2 for mounting a semiconductor element. However, it is different in that the other surface of the insulating substrate 5 is a connection plane for an external circuit board. The connection plane of the base member has a connection part 7 to be connected with an external circuit board, and the point 7 is electrically continuous with the conductive circuit 4a.

The film carrier members 1b and 1c other than base member 1a are laminated by bending the film carrier at the folding part 3, or the entire film carrier is bent such that the folding line comes to the folding part. In this way, they are layered on the base member 1a to form a laminate structure as a whole. The internal conductive circuits 4b and 4c in these film carrier members 1b and 1c are respectively connected to the conductive circuits 4a in the base member through the inside of the folding part 3.

The above-mentioned construction affords a film carrier capable of easily forming a laminate type mounting structure as mentioned above.

The shape of the film carrier member is not particularly limited, but can be a circle, rectangle, other polygon or deformed shape. Considering the shape of the semiconductor element, which is square, the shape of the film carrier member is preferably also square as shown in FIG. 1(a), so that mounting density can be increased. The shape of the film carrier members may be different from each other. However, in constituting a single laminate structure, they preferably have the same shape to form the same outer shape upon folding.

The number of the film carrier members to be connected is determined depending on the objective laminates, and is free of any particular limitation.

The pattern of disposed film carrier members pattern of connection) can be any pattern as long as the film carrier members other than the base member are superimposed on the base member to form a single laminate structure. A linear pattern shown in FIG. 1 and a cross pattern shown in FIG. 2 are exemplified.

In the embodiment shown in FIG. 1, the film carrier members have the same outer shape and three film carrier members are connected linearly. In the embodiment of this figure, the film carrier member in the center is the base member.

Figure 2:
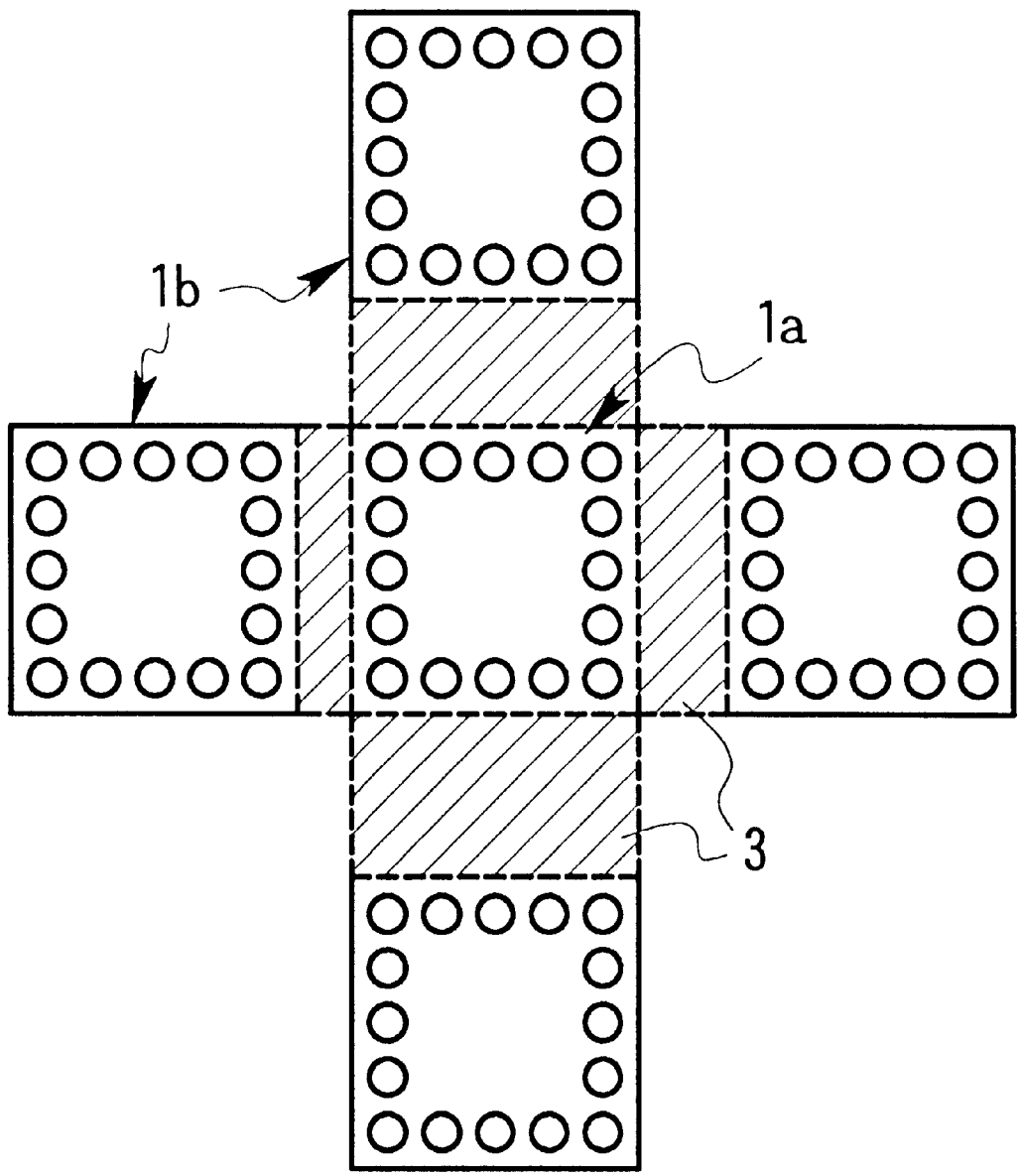
FIG. 2 shows another embodiment of the inventive film carrier. Like FIG. 1(a), the side comprising a mounting plane of the base member (top view) is shown and only the folding part is hatched.

In the embodiment shown in FIG. 2, five film carrier members are connected in the extending directions of the planes to form a simple cross. In this embodiment, the film carrier member at the center of the cross is the base member. The film carrier members have the same outer shape. The outer four film carrier members are connected in such a manner that one film carrier member is connected, via folding part 3, to each of the four sides of the base member 1a. Thus, the outer shape coincides when laminated on the central base member and a cross is formed about the base member 1a.

The embodiments shown in FIGS. 1 and 2 exemplify linear and cross shapes about the base member. The film carrier member 1b can be connected to any of the four sides of the base member 1a in any manner, and a different film carrier member may be connected to the film carrier member 1b and extended further.

The base member need not be situated at the center of the film carrier members but may be situated at an end.

The material of the insulating substrate forming a film carrier member is not limited, and may be any resin material conventionally used for a film carrier, such as thermoplastic resin, thermosetting resin and the like. As shown in FIGS. 1 and 2, when the folding part is formed using the same insulating substrate as used for the film carrier member, polyimide resin is preferable in terms of foldability and mechanical strength.

While the thickness of the insulating substrate is not particularly limited, it is preferably about 2 $\mu$m–500 $\mu$m, and more preferably 5 $\mu$m–150 $\mu$m, to impart mechanical strength and flexibility.

The conductive circuit to be formed in the film carrier member may be set at any position as long as it is inside the insulating substrate and capable of being electrically conducted with the contact point. The conductive circuit is formed by a known method for forming a circuit pattern. The conductive circuit is formed inside the insulating substrate by a method comprising first forming a metal layer on one surface of the resin layer, etching the metal layer to form a conductive circuit, and forming a resin layer thereon. The conductive circuit inside the film carrier member other than the base member is connected to the conductive circuit in the base member, through the inside of the folding part.

The film carrier member comprises at least one surface thereof as a mounting plane. However, the base member exceptionally has only one surface thereof as a mounting plane and the other surface as a connection plane. When the film carrier members other than the base member have only one surface thereof as a mounting plane, the mounting plane may be formed on the same side as or different from the mounting plane of the base member. It is determined according to the manner the film carriers are folded and the use thereof. Typically, all mounting planes are preferably set on the same side as shown in FIG. 1 and FIG. 2, since semiconductor elements are easily mounted. The film carrier members having a mounting plane on only one surface and those having mounting planes on both surfaces may be used in combination.

The mounting connection part of the film carrier member and connection part of the base member may be of any form as long as they can be electrically continuous with the contact targets of a semiconductor element and any external circuit board. These connection parts may be typically protrusions from the surface of the insulating substrate in a hemisphere shape or dome shape (e.g., bump contact). However, the connection parts need not protrude from the surface of the insulating substrate, and may constitute the surface of an insulating substrate or a convex plane, according to the shape of the connection target or the method of connection. For example, an opening may be formed on an insulating substrate, a part of the conductive circuit is exposed in the opening, and the exposed conductive circuit is used as a contact point. When the mounting connection part is the conductive circuit exposed in the opening, the embodiments shown in FIGS. 3(a) and 3(b) are exemplified.

The semiconductor elements to be mounted on the film carrier of the present invention are naked chips cut out separately from a wafer, which are typically IC bare chips. The IC bare chip is a square plate piece having a side of about 3 mm–20 mm, preferably 5 mm–15 mm.

Figure 3:
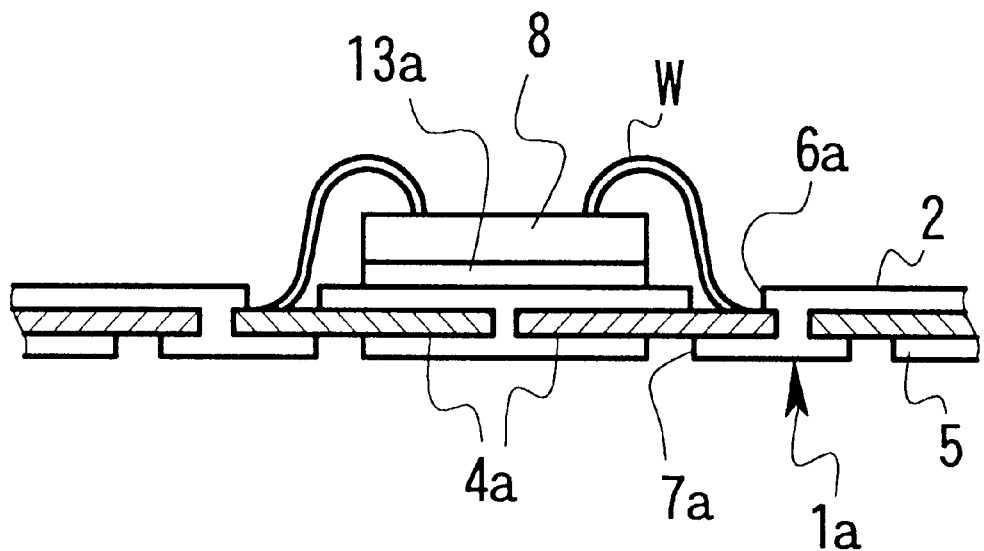
FIGS. 3(a) and 3(b) are cross sectional views of the film carrier of the present invention, which show another embodiment of the mounting connection and connection point.
Figure 3:
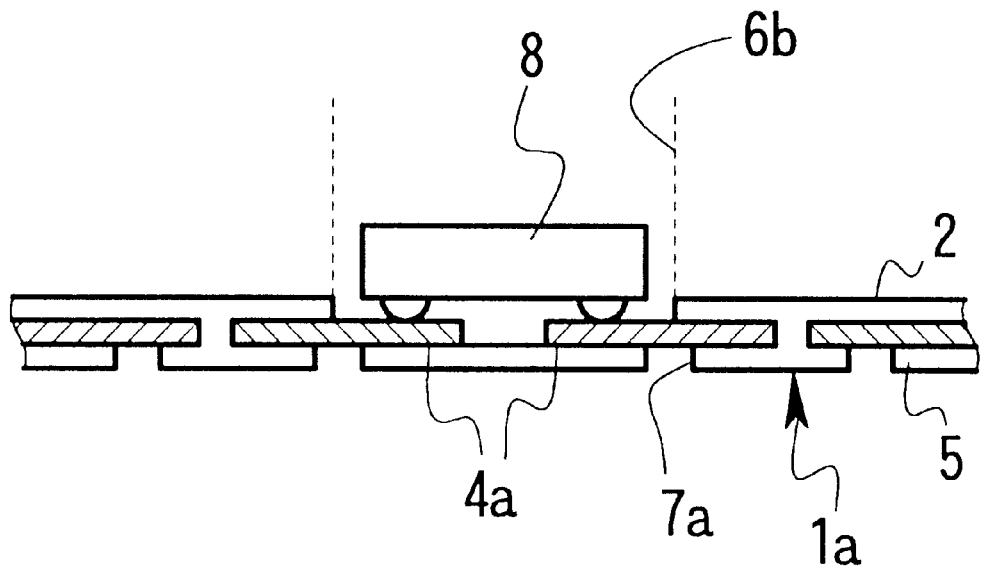

In the embodiment shown in FIG. 3(a), the number of openings formed is the same as the electrodes of a semiconductor element are formed. In addition, the connection part of the base member is the same as the mounting connection part In this figure, only the base member is enlarged. The mounting plane comprises an opening 6a corresponding to the mounting connection part, and a conductive circuit is exposed at the inner bottom. The connection plane also comprises an opening 7a corresponding to the connection part, and a conductive circuit 4a is exposed at the inner bottom. The semiconductor element 8 to be mounted is set on the mounting plane with an adhesive layer 13a. The electrode and the conductive circuit are connected by a wire W for wire bonding.

In the embodiment shown in FIG. 3(b), one opening is formed for one semiconductor element. The shape of the opening 6b permits fitting of the semiconductor element 8 to be mounted. The conductive circuit 4a exposed inside the opening is disposed at a position permitting direct connection to the electrodes of the semiconductor element to be fit in the opening. On the other hand, an electrode is set at the underside of the semiconductor element to be fit in the opening, each electrode pad and the conductive circuit being aligned in position, thereby making direct contact.

The connection part can be formed by a known method. For example, when it is a bump contact, a hole is formed on the insulating substrate at the position where the connection part is to be formed to expose a conductive circuit. Electroplating using the conductive circuit as a negative electrode is applied to precipitate a good conductive metal in the hole, fill the hole with the metal and to make a protrusion from the hole. The conductive circuit is designed to run beneath or near the contact part, so that the connection part and the conductive circuit can be electrically circuited.

A method for exposing the conductive circuit inside the opening may be, for example, laser processing, photolithography processing, chemical etching and the like for an insulating substrate having a copper foil cover layer. In general, an opening is preferably formed using a UV laser having an oscillation wavelength in the ultraviolet region. To the exposed copper foil is adhered, with an adhesive, an insulating film after perforation processing, to form a structure wherein a conductive circuit is exposed at the inner bottom of the opening.

The connection part may be as shown in FIG. 3(a), wherein a conductive circuit is exposed at the inner bottom of the opening, and a solder ball protruding from each opening may be formed. The solder ball is a kind of bump contact. The above-mentioned bump contact is formed by precipitation caused by plating. In contrast, the solder ball is formed by placing a solid solder ball at each opening, filling the same by reflow processing and allowing protrusion thereof of a ball-like shape from the connection plane.

By making the shape of the mounting connection part and connection part a solder ball shape, the same mounting method as used in conventional laminate type mounting structure, such as reflow soldering, can be easily employed for mounting a semiconductor element and connection with an external circuit board.

With the aim of improving the connection reliability of a solder ball connection or wire connection by wire bonding, a coating layer consisting of one or more layers of a metal is preferably formed on the conductive circuit exposed inside the opening. This metal is a good conducting material and capable of connecting with different metals, which is exemplified by gold, silver, palladium and a laminate having a lower layer made of nickel and a surface layer made of gold.

The folding part may be of any forms as long as it internally comprises a conductive circuit for electrical connection of the conductive circuit inside the base member to the conductive circuit inside a different film carrier member, and can be folded.

The folding part may be made separately as a substrate, from a material suitable for folding, and connected to a film carrier member, or as shown in FIG. 1, the insulating substrates of the film carrier members may be extended to be integrally formed as a single insulating substrate. The embodiment of FIG. 1 is preferable in terms of handling property. That is, a film carrier of the present invention can be manufactured by merely forming a conductive circuit at once on a single insulating substrate and forming a contact part in the area to be a film carrier member. The single insulating substrate integrally comprises an area to be a film carrier member and an area to be a folding part. This mode is advantageous in terms of ease of production.

As shown in FIG. 1, the conductive circuit in the folding part may be formed by extending the conductive circuit in the film carrier member.

The position of the folding part can be determined in consideration of the position of the above-mentioned film carrier members. The length of the folding part (distance between film carrier members) can be determined by the size and number of semiconductor elements to be mounted, the thickness of the film carrier member and the number of layers to be laminated.

Figure 4:
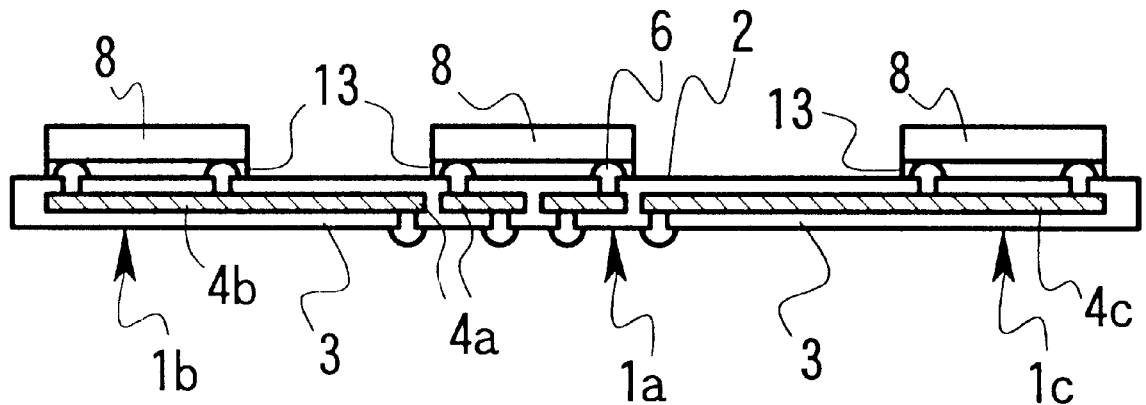
FIG. 4(a) and 4(b) are cross sectional views of one embodiment of the laminate type mounting structure of the present invention, wherein only the conductive circuit is hatched and only the outer shape of the semiconductor element is shown (which will hereinafter be the case with respect to cross sectional views).
Figure 4:
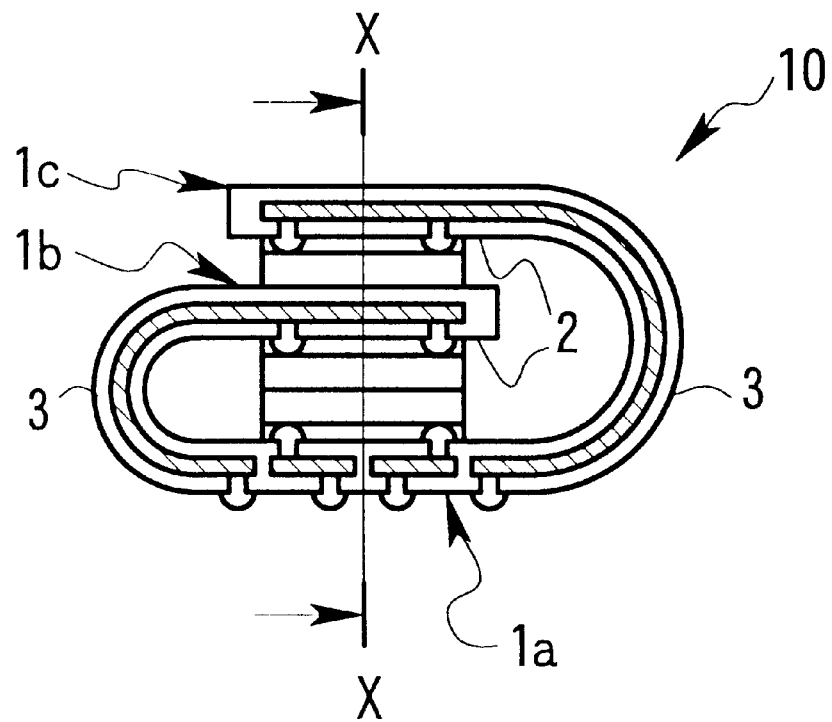

The laminate type mounting structure comprising the inventive film carrier is explained in the following. In the present invention, the inventive film carrier is folded to form a laminate. This laminate is called a laminate type mounting structure, since it not only includes semiconductor elements mounted thereon, but also secures a connection part for external connection on the outermost surface of the laminate, to which a semiconductor element of each layer is connected. FIG. 4 shows one embodiment wherein the film carrier is the one shown in FIG. 1.

FIG. 4(a) shows a film carrier before folding at the folding part 3. Semiconductor elements 8 are mounted on mounting planes 2 of respective film carrier members 1a–1c. The semiconductor elements 8 are electrically circuited and connected to conductive circuits (4a–4c) via mounting connection parts 6 (bump contact). An adhesive 13 is filled in the gap between the semiconductor element and the mounting plane to bond them.

FIG. 4(b) shows the laminate type mounting structure of FIG. 4(a) except that the film carrier is folded at the folding part 3. The inventive laminate type mounting structure 10 comprises the semiconductor element shown in FIG. 4(a) and film carrier members 1b and 1c successively laminated on the base member 1a, with the connection plane of the base member 1a as the lowermost plane of the laminate. In the embodiment of FIG. 4(b), film carrier members 1b and 1c other than the base member 1a are superimposed on the mounting plane 2 facing the base member 1a.

The way to fold the film carrier carrying semiconductor elements is not limited. In the case where the film carrier members are linearly connected, for example, when the mounting planes are on the same side, they may be folded to depict the shape of a '6' (roll shape, embodiment of FIG. 4(b)). When the mounting planes are on different sides, they may be folded to depict the shape of an 'S' (basically zigzag). In addition, they may be combined in an infinite number of modes, such as connecting the film carrier members to form a cross, extensive connection from a cross and the like. The mode of folding can be optionally determined according to the intended use.

Figure 5:
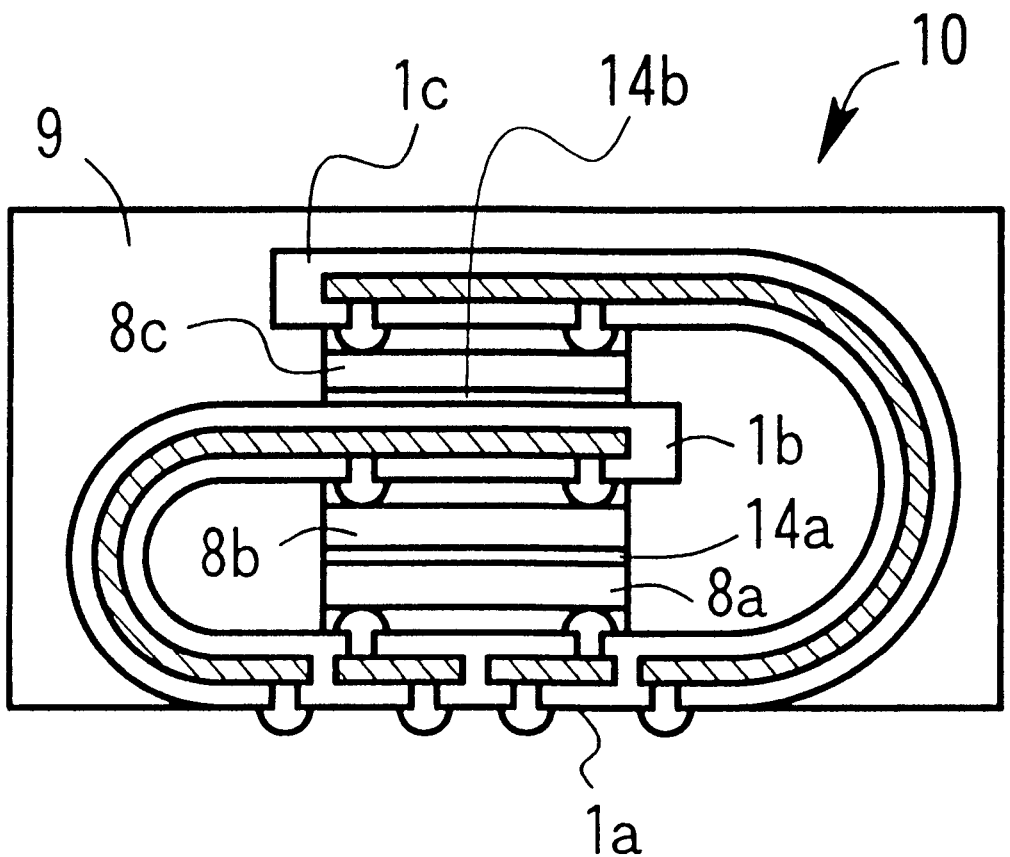
FIG. 5 is a cross sectional view of the laminate type mounting structure shown in FIG. 4. In this figure, one embodiment of the resin mold is also shown.

When a laminate type mounting structure as shown in FIG. 4 is to be manufactured, the laminated layers may be further connected to each other. In the embodiment of FIG. 5, a semiconductor element 8a mounted on the base member 1a and a semiconductor element 8b mounted on the next film carrier member 1b are bonded, via an adhesive layer 14a, to the laminate type mounting structure 10 shown in FIG. 4. The semiconductor element 8c mounted on the film carrier member 1c is bonded via an adhesive layer 14a to the insulating substrate on the lower side of the film carrier member 1b.

The adhesive to be used between layers, an adhesive used for mounting a semiconductor element by wire bonding, and an adhesive to be filled in the gap between the semiconductor element mounted and film carrier member may be a known adhesives used for typical semiconductor-mounting products.

The laminate type mounting structure of the present invention may comprise film carrier members mounting semiconductor elements being merely laminated, or sealed in various manners using a resin.

The embodiment shown in FIG. 5 comprises sealing with a resin. In this embodiment, the inventive laminate type mounting structure 10 as a whole is sealed with a resin 9 except the exposed connection plane of the base member 1a, and packaged.

Figure 6:
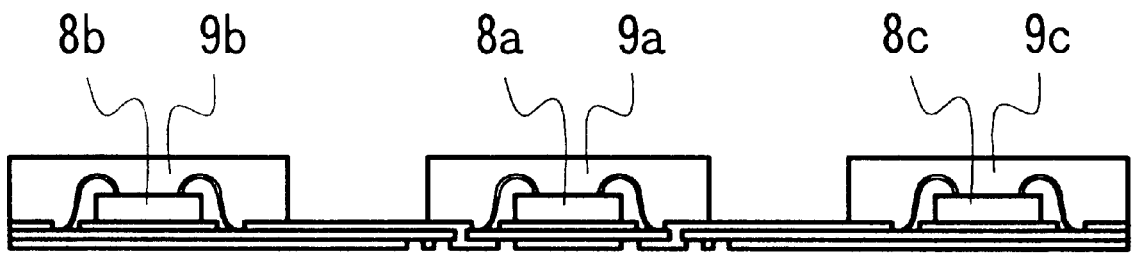
FIG. 6(a) and 6(b) are cross sectional views showing another embodiment of the laminate type mounting structure of the present invention. In these figures, one embodiment of the resin mold is also shown.
Figure 6:
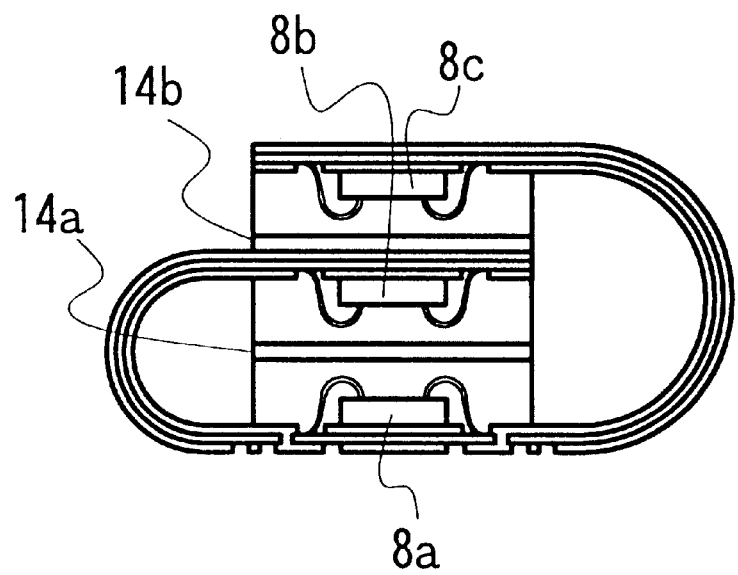

The embodiments shown in FIG. 6 comprise different sealing methods using a resin. FIG. 6(a) shows a film carrier before folding at the folding part 3. In the embodiment of FIG. 6(a), the semiconductor elements 8a, 8b and 8c are mounted on a film carrier by wire bonding as shown in FIG. 3(a), at which stage, they are respectively sealed with resin 9a, 9b and 9c. FIG. 6(b) shows the laminate type mounting structure of the present invention wherein the film carrier members shown in FIG. 6(a) have been laminated. The film carrier members folded at folding parts, superimposed on one another upon folding at folding parts and fixed by adhesive layers 14a and 14b form a single laminate structure.

The resin used for sealing may be a known one used for general semiconductor elements.

Figure 13:
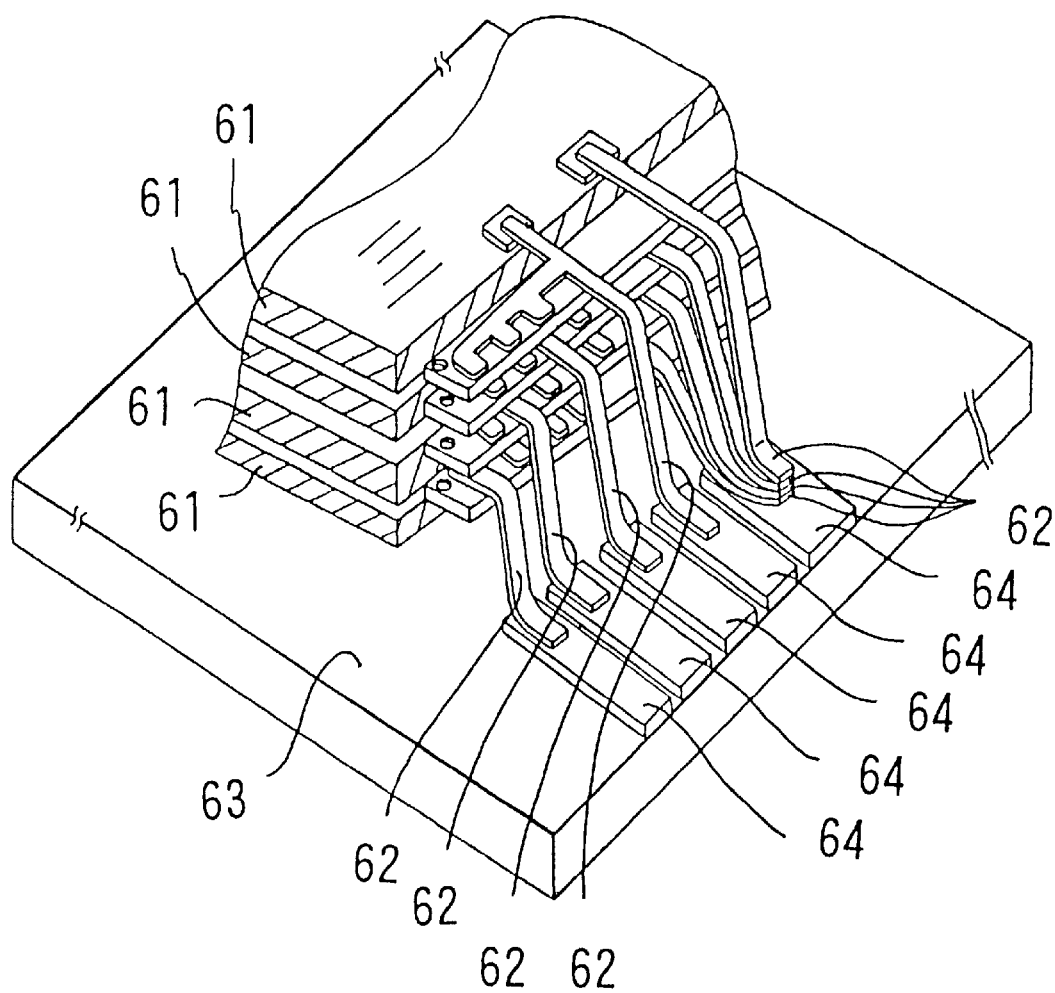
FIG. 13 is a perspective view showing a conventional laminate type mounting structure.

The laminate type mounting structure of the present invention itself functions as a semiconductor device. When it is further connected to an external circuit board, a laminate type mounting structure interchangeable with a conventional laminate type mounting structure as shown in FIG. 13, in terms of external terminal arrangement, can be obtained.

Figure 7:
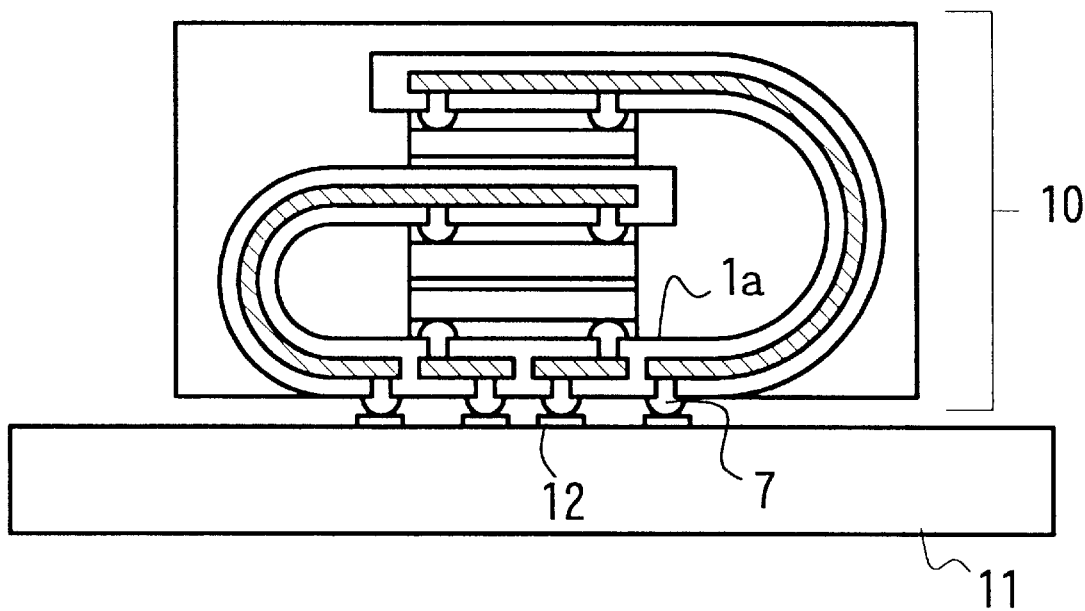
FIG. 7 is a cross sectional view wherein the laminate type mounting structure shown in FIG. 5 is further connected to an external circuit board.

FIG. 7 shows a laminate type mounting structure interchangeable with conventional structures by connecting the laminate type mounting structure 10 shown in FIG. 5 to an external circuit board 11. The connection part 7 of the base member 1a is connected to a land part (conductive connection target) 12 of the external circuit board 11 to provide for conduction. In the embodiment shown in FIG. 7, the mounting connection part and the connection contact point are bump contacts and the entire laminate structure is integrally sealed with a resin. The respective modes of contact points, connection method, sealing and the like may be changed to those mentioned above to combine it in a desired manner.

As shown in FIG. 7, when a laminate type mounting structure is connected to an external circuit board to form a new laminate type mounting structure, the resin sealing is not performed in the previous step, but may be performed after connecting to the external circuit board.

Figure 8:
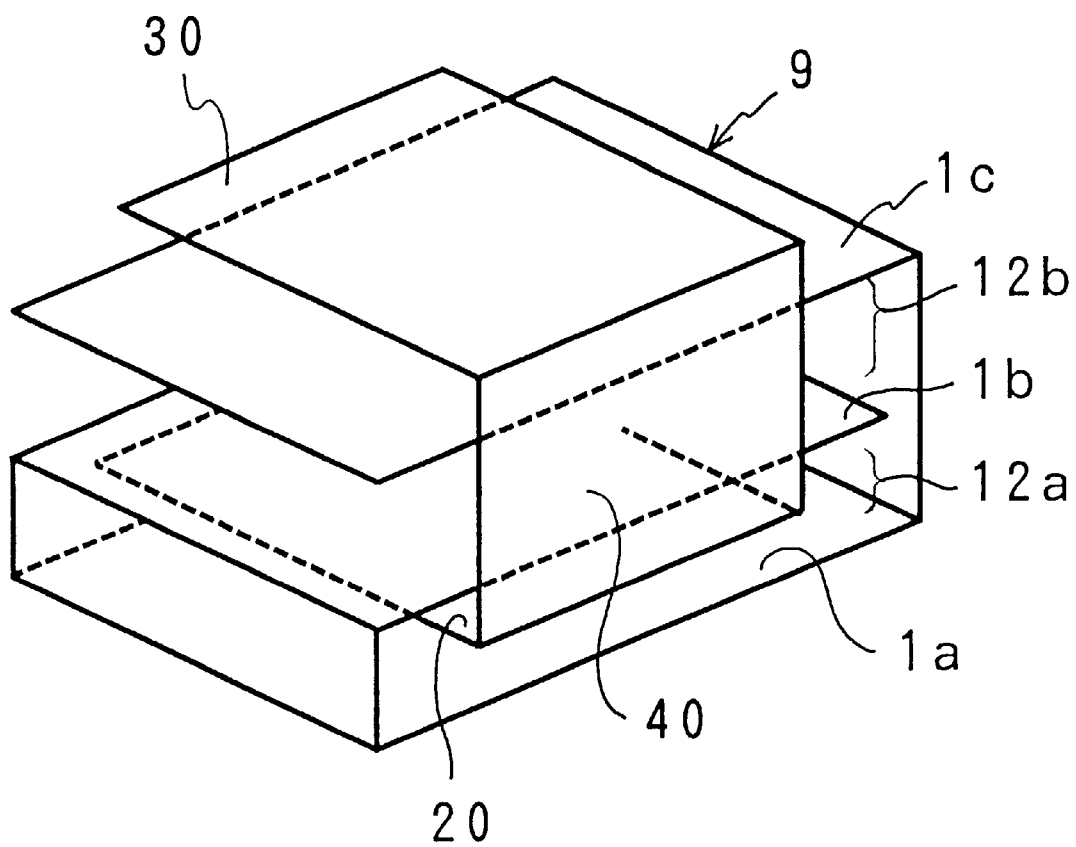
FIG. 8 is a schematic view showing one embodiment of the heat-releasing structure set on the inventive laminate type mounting structure.

The heat-releasing structure is explained in the following. FIG. 8 is a perspective view showing one embodiment of the heat-releasing structure incorporated in the inventive laminate type mounting structure. In this embodiment, the laminate type mounting structure 10, obtained by mounting semiconductor elements on the inventive film carrier, is the same as shown in FIG. 4(b), and comprises three layers of film carrier members 1a, 1b and 1c. The semiconductor elements mounted on the inventive film carrier are not shown in the figures. A heat conductive heat-absorbing plate 20 is set in at least one interlayer (i.e. space between layers) 12a or 12b (in this embodiment, interlayer 12a between layers 1a and 1b) between two layers selected from the layers 1a, 1b and 1c. A heat conductive heat-releasing plate 30 is formed on the uppermost plane of this laminate type mounting structure. The heat-absorbing plate 20 and heat-releasing plate 30 are connected in a heat conductive manner via a heat conductive connection part 40. By this heat-releasing structure, the heat generated in the semiconductor elements mounted on the film carrier members 1a and 1b can be released to the outside from the heat-releasing plate 30 through the heat-absorbing plate 20.

The heat-absorbing plate and heat-releasing plate may be connected in any manner as long as they are connected in a heat conductive manner. In particular, a method comprising folding a heat conductive plate to give a heat-absorbing plate area, a heat-releasing plate area and a connection part connecting them, and incorporating the plate into this structure is most simple and easy, and affords desirable heat releasability. Various modes of folding such heat conductive plate are shown in the following.

Figure 9:
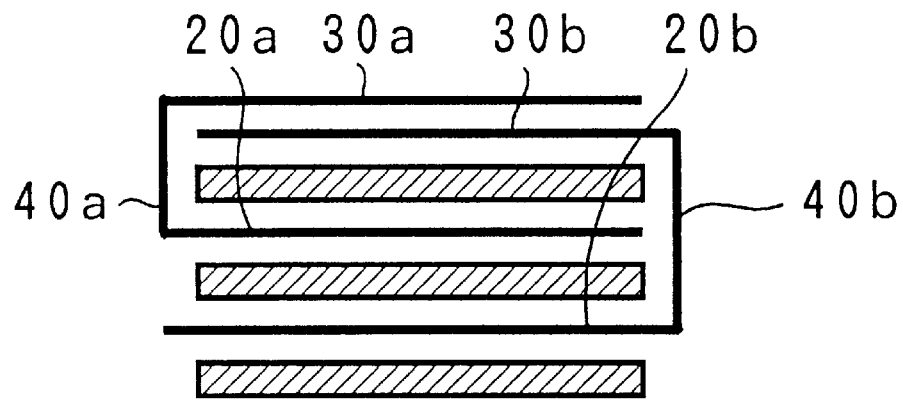
FIG. 9(a), 9(b) and 9(c) show one embodiment of the heat-releasing structure of the laminate type mounting structure of the present invention.
Figure 9:
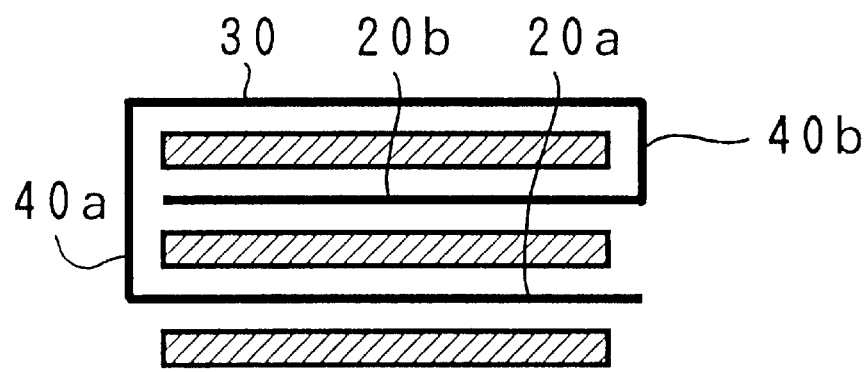
Figure 9:
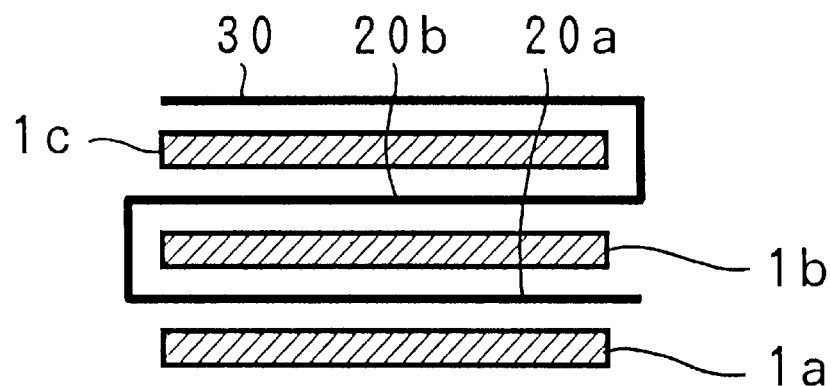

FIG. 9 shows embodiments using the laminate type mounting structure shown in FIG. 4(b), wherein said laminate type mounting structure is cut along the line X—X in FIG. 4(b) and the end portion alone is shown, and the semiconductor elements mounted and internal conductive circuits are omitted.

FIG. 9(a) shows an embodiment wherein the same number of heat-absorbing plates and heat-releasing plates are used to make each correspond to its counterpart In this embodiment, the corresponding number (namely, the number of layers where heat-absorbing plates are applied) of heat conductive plates were prepared, and each was folded separately to form connections between the heat-absorbing plate and heat-releasing plate. The plates are folded to give a channel shape comprising a heat-absorbing plate, an area 30a or 30b to be a heat-releasing plate, and an area 40a or 40b to be a connection part connecting the two. This embodiment enables independent transfer of the heat generated in each layer to the heat-releasing plate without influencing other layers. In addition, folding of and incorporation of the heat conductive plate into the laminate type mounting structure is easy. Thus, this embodiment is most preferable.

FIGS. 9(b) and 9(c) show embodiments wherein plural heat-absorbing plates correspond to a single heat-releasing plate. In the embodiment of FIG. 9(b), one heat conductive plate is folded in a roll shape and heat-absorbing plates 20a and 20b are connected to a common heat-releasing plate 30 via two connection parts 40a and 40b. In the embodiment of FIG. 9(c), one heat conductive plate is folded to form an S shape, and heat-absorbing plates 20a and 20b are connected to a common heat-releasing plate 30 via a single path.

In the embodiments of FIG. 9, the direction from the film carrier member of each layer to the adjacent folding part (hereinafter to be referred to as a direction toward folding part) is perpendicular to the paper surface. The direction from the heat-absorbing plate toward the connection part (hereinafter to be referred to as a direction toward connection part) is horizontal to the paper surface. In other words, when incorporated in the laminate type mounting structure, the direction toward folding part and the direction toward connection part are orthogonal to each other, and the folding part of the film carrier and the connection part of the heat-releasing structure do not overlap. Different sides of the laminate type mounting structure are used to connect the interlayer. This mode is advantageous in that it does not cause an influence of heat from the connection part of the heat-releasing structure exerted on the folding part, and the heat is released from the connection part.

Figure 10:
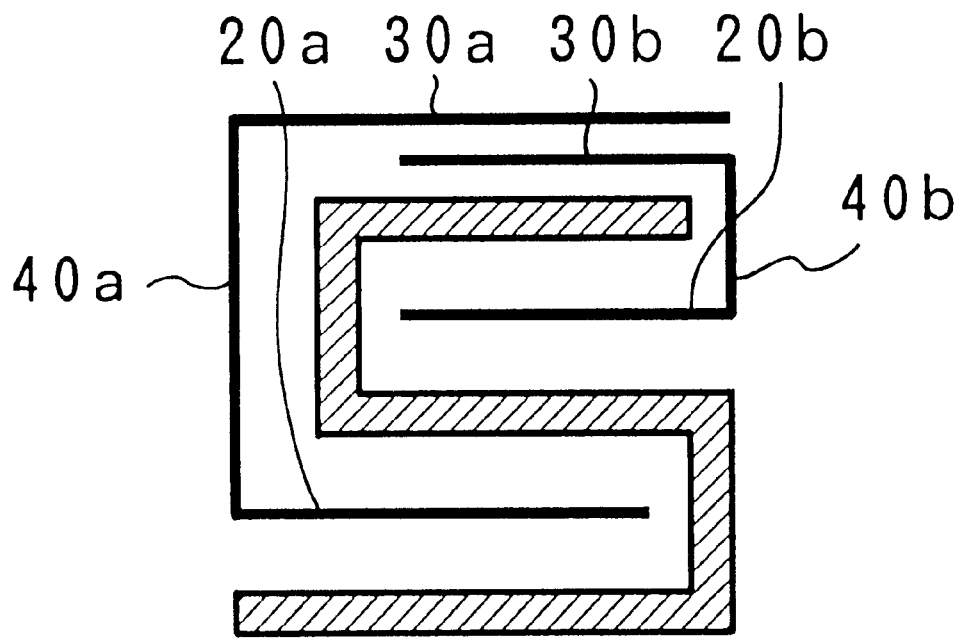
FIG. 10(a) and 10(b) show another embodiment of the heat-releasing structure of the inventive laminate type mounting structure.
Figure 10:
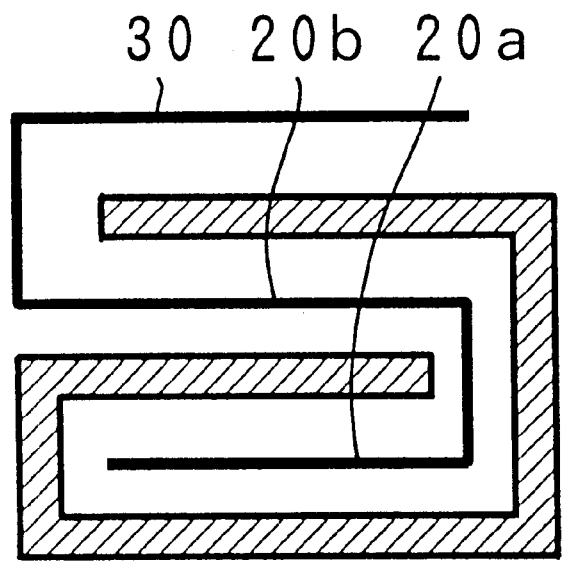

In the embodiments of FIG. 10, the heat-releasing structure itself is the same as in the embodiments of FIG. 9. However, they are different in that the direction of incorporation into the laminate type mounting structure is different from the embodiment of FIG. 9. The direction toward folding part and the direction toward connection part are the same. In FIG. 10, the laminate type mounting structures are seen from the same direction as in FIG. 4(b), and the folding pattern of the inventive film carrier is shown.

In the embodiment of FIG. 10(a), the inventive film carrier has an S-shaped folding pattern. The heat-releasing structure comprises a heat-absorbing plate and a heat-releasing plate which correspond to each other as in FIG. 9(a) and the heat conductive plate is folded in a channel shape.

In the embodiment of FIG. 10(b), the inventive film carrier has a roll-folding pattern. The heat-releasing structure comprises plural heat-absorbing plates corresponding to one heat-releasing plate, as in FIG. 9(c), and one heat conductive plate is folded in an S-shape.

When plural heat-releasing plates are formed and superimposed on the uppermost surface, these heat-releasing plates are maintained at a certain distance secured between them, so that air can flow through the gap, thus ensuring better heat releasability. The gap between the heat-releasing plates is secured by changing the length of the connection part when folding the heat conductive plate. In addition, a protrusion to act as a spacer may be formed on the laminate type mounting structure.

Figure 11:
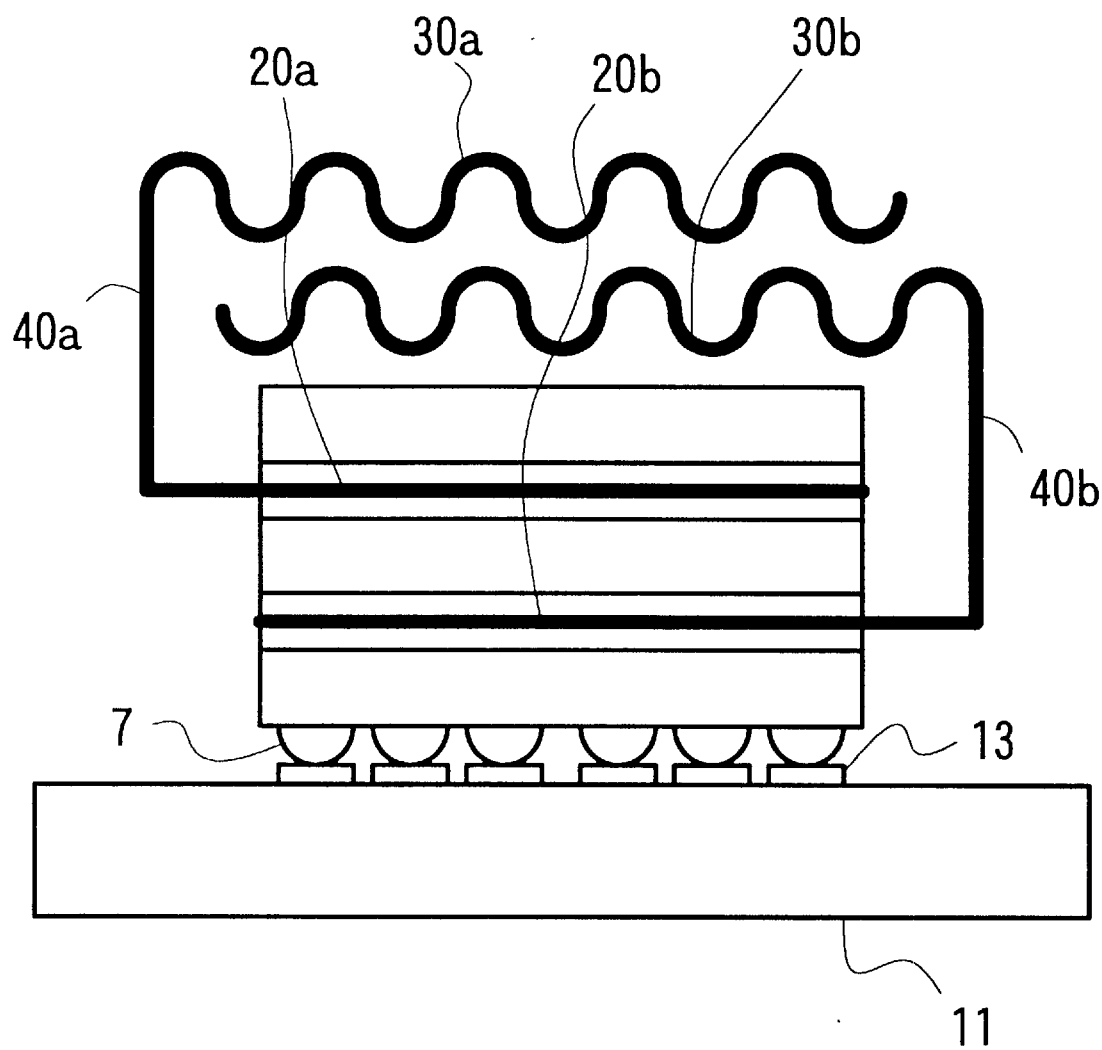
FIG. 11 shows one embodiment wherein the laminate type mounting structure shown in FIG. 9(a) is further connected to an external circuit board.

The heat-releasing plate is preferably processed to have improved heat releasability. For example, irregularities (inclusive of combinations of concave and convex surfaces, and combinations of flat surface and convex or concave surface) may be formed, or a through-hole may be formed as in a punching plate, or a surface area is increased by separately imparting a heat-releasing fin. Examples of irregularities include an embossed plate and corrugated heat-releasing plates 30a and 30b as shown in FIG. 11.

The material of the heat conductive plate is preferably lightweight and has superior thermal conductivity, and is exemplified by copper and aluminum.

Adhering adjacent laminate layers and inserting heat-absorbing plates preferably forms the laminate type mounting structure of the present invention.

The laminate type mounting structure of the present invention may be sealed with a resin. For example, an embodiment wherein the connection plane and heat-releasing plate alone of the base member la are exposed and other parts are sealed with a resin, or an embodiment wherein a semiconductor element is mounted on a film carrier and separately sealed at this stage may be employed.

While the inventive laminate type mounting structure by itself functions as a semiconductor device, by connecting the device to an external circuit board, a laminate type mounting structure interchangeable with conventional laminate type mounting structures, in terms of external terminal arrangement, can be obtained.

By connecting the laminate type mounting structure of FIG. 9(a) to an external circuit board, a laminate type mounting structure of FIG. 11 having an external terminal interchangeable with conventional structures can be provided. In this embodiment, the connection part 7 of the base member la is connected to the land part (connection part) 13 of the external circuit board 11 to provide for conduction.

EXAMPLE 1

In this Example, the film carrier shown in FIG. 1 was prepared. Using this film carrier, the laminate type mounting structure shown in FIG. 5 was prepared. The embodiment of FIG. 1 comprises film carrier members connected linearly. When referring to the size of the film surface, the size in the direction of the side linearly connected is referred to as a 'length', and the size in the direction perpendicular to the same is called a 'width'.

Preparation of Film Carrier

Three film carrier members were connected linearly as shown in FIG. 1, wherein the central film carrier member was the base member. The size of each film carrier member was 10 mm length×10 mm width, the size of two folding parts were each 3 mm length×10 mm width and 5 mm length×10 mm width, and the size of the entire insulating substrate was length 38 mm×10 mm width. The insulating substrate was made from a polyimide resin and had a thickness of 0.1 mm. A copper conductive circuit was formed on the insulating substrate and a coating layer made from the same material as the insulating substrate was formed to give a structure wherein the conductive circuit was embedded in the insulating substrate. Then, using one surface of the insulating substrate as a mounting plane, a bump contact was formed as a mounting connection part on the insulating substrate in the area to be the film carrier member. In addition, a bump contact was formed in the connection part on the connection plane of a base member for the connection with an external circuit board, whereby the inventive film carrier was obtained.

Mounting of Semiconductor Element

An IC bare chip having an outer size of 7 mm×7 mm was mounted as a semiconductor element on a mounting plane of each film carrier member of the film carrier prepared above. The mounting plane and the semiconductor element were adhered with a thermosetting adhesive.

Preparation of Laminate Type Mounting Structure

A film carrier comprising a semiconductor element was folded at a folding part and interlayer (between semiconductor elements, and between semiconductor element and insulating substrate) was bonded with an epoxy adhesive, whereby a laminate type mounting structure of FIG. 4(b) was obtained. The entire laminate type mounting structure was sealed with a resin except the connection plane of the base member to give a laminate type mounting structure of FIG. 5.

Connection with External Circuit Board

The laminate type mounting structure sealed with a resin was connected to an external circuit board 11 as shown in FIG. 7. The connection was easily established since the need to connect each semiconductor element with an external circuit board was obliterated. Since the semiconductor element was previously laminated integrally, handling was easy.

EXAMPLE 2

In this example, a semiconductor element was mounted on a film carrier member by wire bonding as shown in FIG. 3(a), and each semiconductor element was independently sealed with a resin as shown in FIG. 6, whereby a structure involving sealing of each semiconductor element was prepared.

Preparation of Film Carrier

The film carrier member had the same outer size, connection pattern and the like as in Example 1. In the same manner as in Example 1, a circuit board wherein a conductive circuit was embedded in the insulating substrate was prepared. Using a UV laser, an opening was formed at the position where the mounting the connection part and connection part were to be formed, and a conductive circuit was exposed in the inside. To the surface of the exposed conductive circuit was applied a 1 μm-thick gold coating layer by plating to give the inventive film carrier.

Mounting of Semiconductor Element

An IC bare chip having an outer size of 7 mm×7 mm was mounted, using an adhesive, as a semiconductor element mounted on a mounting plane of each film carrier member of the film carrier prepared above. Wire bonding using a gold wire W for internal connection completed the mounting.

Sealing with Resin

As shown in FIG. 6, each of the mounted semiconductor element was respectively sealed with a resin by a conventional sealing method.

Preparation of Laminate Type Mounting Structure Carrier

The film carrier was folded at the folding part and a pressure sensitive adhesive double coated tape was applied between layers (between semiconductor elements, and between semiconductor element and insulating substrate) to give a laminate type mounting structure as shown in FIG. 6(b).

Connection to External Circuit Board

The connection plane of the above-mentioned laminate type mounting structure was faced upward. One solder ball having a eutectic structure was disposed on the opening formed as a connection contact point, and melted by reflow processing to fill the inside of the opening, and to form a ball-like solder ball contact point (bump contact). The obtained laminate type mounting structure was set at the predetermined mounting position of an external circuit board to confirm easy connection by reflow processing.

In the following Examples, a heat-releasing structure was set on the inventive laminate type mounting structure, and the mode of heat-releasing plate and heat releasability by the presence or absence of resin sealing were examined.

EXAMPLE 3

In this example, a semiconductor element was mounted on the inventive film carrier shown in FIG. 1, and a three-layer laminate type mounting structure shown in FIG. 4 was prepared, which was followed by connection to an external circuit board. The semiconductor element was naked and free of resin sealing, and the heat-releasing plate was a flat plate. The inventive film carrier shown in FIG. 1 had film carrier members connected linearly.

In the same manner as in Example 1, a film carrier was prepared and a semiconductor element was mounted.

Preparation of Heat-releasing Structure

To a copper plate having a width (size in the direction of length of the inventive film carrier) of 8 mm and a thickness of 0.5 mm was applied, in the entirety thereof, nickel electroplating in a thickness of 1.0 μm to form a plate for heat-releasing structure. Using two plates, two members for the channel-shaped heat-releasing structure were prepared by folding the plate. Each of the members comprised a part to be a heat-absorbing plate (outer shape 8 mm×8 mm), a part to be a heat-releasing plate (outer shape 8 mm×8 mm) and a connection part to connect them. The length of the connection part was determined to secure the distance (0.5 mm) between the uppermost surface and the heat-releasing plate, as well as the distance (0.5 mm) between two heat-releasing plates. These distances were determined in consideration of the distance between the uppermost surface and interlayer of the laminate type mounting structure.

Assembly of Laminate Type Mounting Structure

The folding part of the inventive film carrier comprising a semiconductor element was folded as shown in FIG. 2(b) to give a laminate type mounting structure. The heat-absorbing plate of the channel-shaped member was inserted between layers. Then, each layer and the heat-absorbing plate (namely, the top surface of the semiconductor element and heat-absorbing plate, or rear surface of the film carrier member and heat-absorbing plate) were adhered, with an adhesive, to fix them into one laminate. In this way, a laminate type mounting structure of FIG. 4(a) was obtained. During the assembly of the laminate type mounting structure, formation of the laminate structure and incorporation of heat-releasing structure were easy. Nevertheless, the final product had high dimensional precision, high connection reliability and high reliability in strength.

The heat releasability was examined at the last stage (same in the following examples).

EXAMPLE 4

In the same manner as in Example 3 except that a semiconductor element was mounted on the inventive film carrier and the semiconductor element was sealed respectively with a resin, the laminate type mounting structure of the present invention was prepared.

EXAMPLE 5

In the same manner as in Example 3 except that a heat-releasing plate was corrugated, the laminate type mounting structure of the present invention was prepared. The wave formed an approximate sine curve of oscillation width 0.5 mm×pitch (length of one cycle) 1.0 mm.

EXAMPLE 6

In the same manner as in Example 3 except that a semiconductor element was mounted on the inventive film carrier and the semiconductor element was respectively sealed with a resin, and that a heat-releasing plate was corrugated, the laminate type mounting structure of the present invention was prepared. The wave was the same as in Example 5.

Comparative Example 1

In the same manner as in Example 3 except that a heat-releasing structure was not used, the laminate type mounting structure of the present invention was prepared.

Comparative Example 2

In the same manner as in Example 3 except that a semiconductor element was mounted on the inventive film carrier, the semiconductor element was sealed with a resin and a laminate was prepared without a heat-releasing structure, the laminate type mounting structure of the present invention was prepared.

The laminate type mounting structures obtained in the above-mentioned Examples 3–6 and Comparative Examples 1 and 2 were examined for heat releasability by heat resistance wind tunnel test and compared. The heat resistance was measured according to the method of SEMI (G38-87).

The measurement conditions of the heat resistance wind tunnel test were as follows.

(a) increase in air temperature: ΔTa=50° C.

(b) air flow rate: 0, 1, 2, 3 m/s

The laminate type mounting structure test samples were evaluated after being mounted on a heat resistance measurement substrate according to SEMI.

Figure 12:
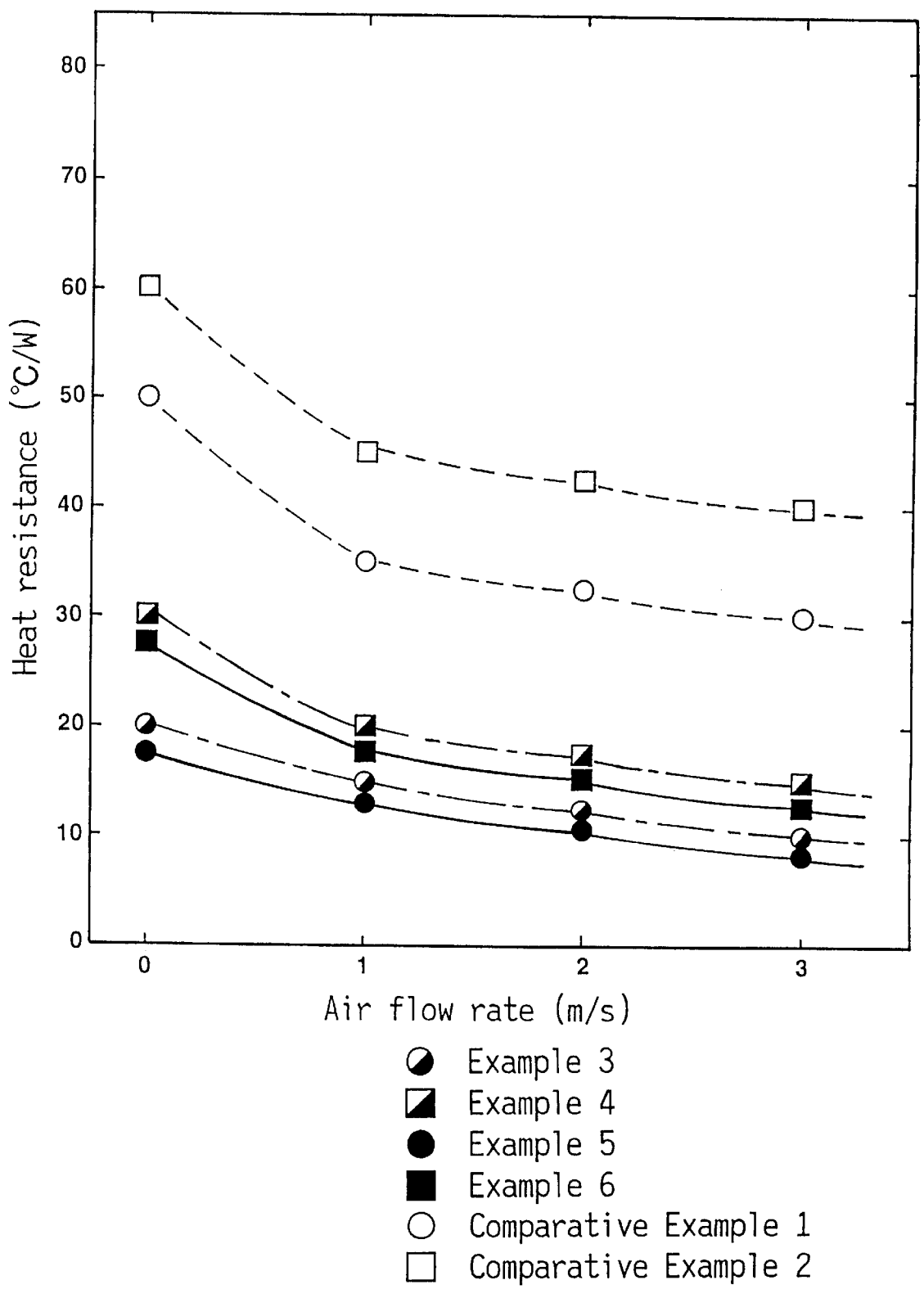
FIG. 12 is a graph showing the heat releasability of the laminate type mounting structures manufactured in an Example and a Comparative Example, in relation to air flow rate [m/s] and thermal resistance [° C./W].

The test results are shown in FIG. 12 in a graph showing the relation of air flow rate (m/s) and heat resistance (° C./W).

Sealing and heat-releasing structures of Examples 3–6 and Comparative Examples 1 and 2 are summarized as follows.

|  | sealing | heat-releasing structure | heat-releasing plate |
|---|---|---|---|
| Example 3 | — | present | flat plate |
| Example 4 | sealed | present | flat plate |
| Example 5 | — | present | corrugated plate |
| Example 6 | sealed | present | corrugated plate |
| Comparative Example 1 | — | — | — |
| Comparative Example 2 | sealed | — | — |

Sealing with Resin

The results are shown in the graph of FIG. 12. Comparison of the sets of Example 3 and Example 4, Example 5 and Example 6, and Comparative Example 1 and Comparative Example 2 obviously reveals that the heat resistanceΘja of the laminate type mounting structure improved by about 10° C./W in the naked mode in the absence of wind without resin sealing relative to that with resin sealing. Thus, when heat resistance may pose problems, the use of a naked semiconductor element to prepare a laminate type mounting structure would be more beneficial.

Heat-releasing Structure

The results are shown in the graph of FIG. 12. Comparison of Example 3 and Comparative Example 1 obviously reveals that the heat resistanceΘja of the laminate type mounting structure improved from 60° C./W to 30° C./W in the absence of wind. Comparison of Example 4 and Comparative Example 2 obviously reveals that the heat resistanceΘja of the laminate type mounting structure improved from 50° C./W to 20° C./W in the absence of wind, thus demonstrating a drastic improvement of about 30° C./W.

Corrugated Heat-releasing Plate

The results are shown in the graph of FIG. 12. Comparison of Example 3 and Example 5, and Example 4 and Example 6 obviously reveals that the heat resistanceΘja of the laminate type mounting structure improved by about 10° C./W when the heat-releasing plate was corrugated rather than a flat plate.

Due to the invention of the film carrier, the need to prepare the same number of film carriers as the semiconductor elements has been obliterated and semiconductor elements are not dispersed after mounting. This facilitates transport and storage of semiconductor elements, as well as fabrication of a laminate type mounting structure, ultimately resulting in lower production costs. The inventive laminate type mounting structure has been completely connected between layers therein before connection with an external circuit board and electrodes of every carrier member gather as terminals on an external connection plane, where it functions as a single independent semiconductor device. Thus, when an external circuit board is connected, a lead is not necessary, thereby obliterating lead processing, the need of positioning of the lead and the external electrode and the connection thereof.

In addition, the presence of a heat-releasing structure advantageously leads to efficient release of the heat generated by the semiconductor element in each layer.

This application is based on application Nos. 128406/1997, 297581/1997 and 297476/1997 filed in Japan, the contents of which are incorporated hereinto by reference.

What is claimed is:

1. A film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit; and wherein each of the film carrier members is shaped as a square, and the film carrier members other than the base member are respectively connected to four sides of the base member.

2. The film carrier claim 1, wherein the mounting connection part of each of the film carrier members comprises a conductive circuit exposed inside an opening formed in the mounting plane.

3. The film carrier of claim 1, wherein the connection part for connection to the external substrate comprises a conductive circuit exposed inside an opening formed in the connection plane.

4. A film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit; and wherein the mounting connection part of each of the film carrier members comprises a conductive circuit exposed inside an opening formed in the mounting plane.

5. The film carrier of claim 4, wherein the shape of said opening is such that said opening is capable of receiving a semiconductor element to be mounted, and the conductive circuit exposed inside the opening is placed at a position where a direct connection with an electrode of the semiconductor element can be established.

6. The film carrier of calm 4, wherein the connection part for connection to the external substrate comprises a conductive circuit exposed inside an opening formed in the connection plane.

7. A film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit; and wherein the connection part for connection to the external substrate comprises a conductive circuit exposed inside an opening formed in the connection plane.

8. The film carrier of calm 7, wherein the mounting connection part of each of the film carrier member comprises a conductive circuit exposed inside an opening formed in the mounting plane.

9. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole;

wherein the heat-absorbing plate and the heat-releasing plate are made from a heat conductive plate comprising a part to be the heat-absorbing plate, a part to be the heat-releasing plate and a plate connection part to connect said two plates; and wherein the heat-absorbing plate and the heat-releasing plate are formed in the same number and the heat conductive plate is folded in a channel shape comprising a part to be the heat-absorbing plate, a part to be the heat-releasing plate and the plate connection part.

10. The laminate type mounting structure of claim 9, wherein the film carrier member other than the base member are laminated on one another with mounting planes thereof facing the base member.

11. The laminate type mounting structure of claim 9, wherein the entire laminate structure in integrally sealed with a resin, except the connection plane of the base member.

12. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole, said film carrier members having conductive circuits connected to a conductive circuit in the base member through inside portions of the folding parts, said base member having a mounting plane and a connection plane on the rear surface thereof and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole;

wherein the heat-absorbing plate and the heat-releasing plate are made from a heat conductive plate comprising a part to be the heat-absorbing plate, a part to be the heat-releasing plate and a plate connection part to connect said two plates; and wherein the film carrier is formed by linearly connecting the film carrier members, and the direction from each film carrier member toward the adjacent folding part and the direction from the heat-absorbing plate toward the plate connection part are orthogonal to each other.

13. The laminate type mounting structure of claim 12, wherein the film carrier members other than the base member are laminated on one another with mounting planes thereof facing the base member.

14. The laminate type mounting structure of claim 12, wherein the entire laminate structure is integrally sealed with a resin, except the connection plane of the base member.

15. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole comprising layers of said film carrier members, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein each of the film carrier members is shaped as a square, and the film carrier members other than the base member are respectively connected to four sides of the base member; and wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole.

16. The laminate type mounting structure of claim 15, wherein the film carrier members other than the base member are laminated on one another with mounting planes thereof facing the base member.

17. The laminate type mounting structure of claim 15, wherein the entire laminate structure is integrally sealed with a resin, except the connection plane of the base member.

18. The laminate type mounting structure of claim 15, wherein a heat conductive heat-absorbing plate is sandwiched at least between two layers from among the layers of the laminate structure, and a heat conductive heat-releasing plate is set on the uppermost plane of the laminate structure, said heat-absorbing plate and heat-releasing plate being connected to each other in a heat conductive manner.

19. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole comprising layers of said film carrier members, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein the mounting connection part of each of the film carrier members comprises a conductive circuit exposed inside an opening formed in the mounting planes; and wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole.

20. The laminate type mounting structure of claim 19, wherein the film carrier members other than the base member are laminated on one another with mounting planes thereof facing the base member.

21. The laminate type mounting structure of claim 19, wherein the entire laminate structure is integrally sealed with a resin, except the connection plane of the base member.

22. The laminate type mounting structure of claim 19, wherein a heat conductive heat-absorbing plate is sandwiched at least between two layers from among the layers of the laminate structure, and a heat conductive heat-releasing plate is set on the uppermost plane of the laminate structure, said heat-absorbing plate and heat-releasing plate being connected to each other in a heat conductive manner.

23. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole comprising layers of said film carrier members, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein the mounting connection part of each of the film carrier members comprises a conductive circuit exposed inside an opening formed in the mounting plane;

wherein the shape of said opening is such that said opening is capable of receiving a semiconductor element to be mounted, and the conductive circuit exposed inside the opening is placed at a position where a direct connection with an electrode of the semiconductor element can be established; and wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole.

24. The laminate type mounting structure of claim 23, wherein the film carrier members other than the base member are laminated on one another with mounting planes thereof facing the base member.

25. The laminate type mounting structure of claim 23, wherein the entire laminate structure is integrally sealed with a resin, except the connection plane of the base member.

26. The laminate type mounting structure of claim 23 wherein a heat conductive heat-absorbing plate is sandwiched at least between two layers from among the layers of the laminate structure, and a heat conductive heat-releasing plate is set on the uppermost plane of the laminate structure, said heat-absorbing plate and heat-releasing plate being connected to each other in a heat conductive manner.

27. A laminate type mounting structure including a film carrier, said film carrier comprising a plurality of generally planar film carrier members that are connected, via folding parts, in the direction of an extension of each plane, wherein one of said film carrier members is a base member and the film carrier members other than the base member are laminated on the base member upon folding the film carrier at the folding parts to form a single laminate structure as a whole comprising layers of said film carrier members, said film carrier members having conductive circuits connected to a conductive circuit in the base member through inside portions of the folding parts, said base member having a mounting plane and a connection plane on the rear surface thereof, and said connection plane having a connection part which is used for connection with an external substrate and which is electrically continuous with the conductive circuit;

wherein each of said film carrier members comprises a conductive circuit formed in an insulating substrate, at least one surface of the insulating substrate being a mounting plane on which to mount a semiconductor element, and the mounting plane having a mounting connection part being electrically continuous with the conductive circuit;

wherein the connection part for connection to the external substrate comprises a conductive circuit exposed inside an opening formed in the connection plane; and wherein semiconductor elements are mounted on the mounting planes of a plurality of the film carrier members, the film carrier being folded at the folding parts, thereby laminating the film carrier members other than the base member on the base member, so that the connection plane of the base member is the lowermost plane of the laminate structure, thus forming a single laminate structure as a whole.

28. The laminate type mounting structure of claim 27, wherein the film carrier members other than the base member are laminated on one another with mounting planes thereof facing the base member.

29. The laminate type mounting structure of claim 27, wherein the entire laminate structure is integrally sealed with a resin, except the connection plane of the base member.

30. The laminate type mounting structure of claim 27 wherein a heat conductive heat-absorbing plate is sandwiched at least between two layers from among the layers of the laminate structure, and a heat conductive heat-releasing plate is set on the uppermost plane of the laminate structure, said heat-absorbing plate and heat-releasing plate being connected to each other in a heat conductive manner.

* * * * *